(12) United States Patent
Parimi et al.

(10) Patent No.: US 12,191,169 B2
(45) Date of Patent: Jan. 7, 2025

(54) SYSTEMS AND METHODS FOR FACEPLATE TEMPERATURE CONTROL

(71) Applicant: Applied Materials, Inc., Santa Clara, CA (US)

(72) Inventors: Venkata Sharat Chandra Parimi, Sunnyvale, CA (US); Sungwon Ha, Palo Alto, CA (US); Runyun Pan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1097 days.

(21) Appl. No.: 16/932,792

(22) Filed: Jul. 19, 2020

(65) Prior Publication Data

US 2022/0020612 A1   Jan. 20, 2022

(51) Int. Cl.
  *C23C 16/455*  (2006.01)
  *C23C 16/458*  (2006.01)
  (Continued)

(52) U.S. Cl.
  CPC .. *H01L 21/67103* (2013.01); *C23C 16/45565* (2013.01); *C23C 16/4557* (2013.01); *C23C 16/4586* (2013.01); *C23C 16/505* (2013.01); *H05B 3/283* (2013.01); *H05B 6/40* (2013.01); *H05B 6/44* (2013.01)

(58) Field of Classification Search
  None
  See application file for complete search history.

(56) References Cited

U.S. PATENT DOCUMENTS

| 2005/0000423 A1* | 1/2005 | Kasai | C23C 16/4557 |
| | | | 118/715 |
| 2005/0258160 A1* | 11/2005 | Goto | H01L 21/67103 |
| | | | 219/270 |

(Continued)

FOREIGN PATENT DOCUMENTS

| CN | 103014673 A | 4/2013 |
| WO | 2008-027845 A2 | 3/2008 |

OTHER PUBLICATIONS

Application No. PCT/US2021/041900, International Preliminary Report on Patentability, Mailed On Feb. 2, 2023, 7 pages.

(Continued)

*Primary Examiner* — Binu Thomas
(74) *Attorney, Agent, or Firm* — Kilpatrick Townsend & Stockton LLP

(57) ABSTRACT

Exemplary semiconductor processing systems may include a chamber body including sidewalls and a base. The chamber body may define an interior volume. The processing systems may include a substrate support extending through the base of the chamber body. The substrate support may be configured to support a substrate within the interior volume. The processing systems may include a faceplate positioned within the interior volume of the chamber body. The faceplate may define a plurality of apertures through the faceplate. The processing systems may include a faceplate heater seated on the faceplate. The faceplate heater may include a first heater coil extending proximate a first area of the faceplate. The faceplate heater may include a second heater coil extending proximate a second area of the faceplate.

16 Claims, 4 Drawing Sheets

(51) Int. Cl.
    *C23C 16/505*     (2006.01)
    *H01L 21/67*     (2006.01)
    *H05B 3/28*     (2006.01)
    *H05B 6/40*     (2006.01)
    *H05B 6/44*     (2006.01)

(56) References Cited

U.S. PATENT DOCUMENTS

| | | | |
|---|---|---|---|
| 2009/0111276 A1* | 4/2009 | Dhindsa | C23C 16/4557 |
| | | | 118/708 |
| 2009/0179085 A1 | 7/2009 | Carducci et al. | |
| 2009/0223932 A1* | 9/2009 | Hida | H01J 37/3244 |
| | | | 156/345.37 |
| 2011/0180233 A1* | 7/2011 | Bera | H01L 21/67109 |
| | | | 165/47 |
| 2012/0048467 A1 | 3/2012 | Mahadeswaraswamy et al. | |
| 2013/0074773 A1* | 3/2013 | Liu | C23C 16/4584 |
| | | | 118/725 |
| 2017/0304849 A1* | 10/2017 | Fovell | C23C 16/45572 |
| 2018/0277340 A1 | 9/2018 | Yang et al. | |
| 2019/0237322 A1 | 8/2019 | Okutani et al. | |
| 2021/0027988 A1* | 1/2021 | Kimura | C23C 16/4557 |

OTHER PUBLICATIONS

International Search Report and Written Opinion mailed Nov. 5, 2021 in International Patent Application No. PCT/US2021/041900, 8 pages.

* cited by examiner

SYSTEMS AND METHODS FOR FACEPLATE TEMPERATURE CONTROL

TECHNICAL FIELD

The present technology relates to components and apparatuses for semiconductor manufacturing. More specifically, the present technology relates to processing chamber components and other semiconductor processing equipment.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process.

Thus, there is a need for improved systems and methods that can be used to produce high quality devices and structures. These and other needs are addressed by the present technology.

SUMMARY

Exemplary semiconductor processing systems may include a chamber body including sidewalls and a base. The chamber body may define an interior volume. The processing systems may include a substrate support extending through the base of the chamber body. The substrate support may be configured to support a substrate within the interior volume. The processing systems may include a faceplate positioned within the interior volume of the chamber body. The faceplate may define a plurality of apertures through the faceplate. The processing systems may include a faceplate heater seated on the faceplate. The faceplate heater may include a first heater coil extending proximate a first area of the faceplate. The faceplate heater may include a second heater coil extending proximate a second area of the faceplate.

In some embodiments, the first heater coil and the second heater coil may be independently operable. The faceplate heater may include an annular component seated about an exterior region of the faceplate. The systems may include a blocker plate seated on the faceplate. The faceplate heater may extend about the blocker plate. The faceplate heater may define a trench about the annular component, and the first heater coil may extend about a first segment of the trench. The second heater coil may extend about a second segment of the trench adjacent the first segment of the trench. The faceplate heater may include at least one thermocouple disposed within the faceplate heater. The faceplate heater may include at least four heater coils. The systems may include a sheet of flexible graphite extending between the faceplate heater and the faceplate. The sheet of flexible graphite may be characterized by a first thickness proximate the first heater coil. The sheet of flexible graphite may be characterized by a second thickness different from the first thickness proximate the second heater coil.

Some embodiments of the present technology may encompass semiconductor processing chamber faceplate assemblies. The assemblies may include a faceplate defining a plurality of apertures through the faceplate. The assemblies may include a faceplate heater coupled with the faceplate. The faceplate heater may include a first heater coil extending proximate a first area of the faceplate, and a second heater coil extending proximate a second area of the faceplate.

In some embodiments the assemblies may include a power source coupled with each of the first heater coil and the second heater coil. The power source may be configured to independently power the first heater coil and the second heater coil. The plurality of apertures may be defined within an interior region of the faceplate, and the faceplate heater may include an annular component seated about an exterior region of the faceplate extending about the interior region of the faceplate. The faceplate heater may define a trench about the annular component. The first heater coil may extend about a first segment of the trench, and the second heater coil may extend about a second segment of the trench adjacent the first segment of the trench. The faceplate heater may include a third heater coil extending proximate a third area of the faceplate. The faceplate heater may include a fourth heater coil extending proximate a fourth area of the faceplate. The third heater coil may extend about a third segment of the trench adjacent the second segment of the trench. The fourth heater coil may extend about a fourth segment of the trench adjacent the third segment of the trench. The assemblies may include a sheet of flexible graphite extending between the faceplate heater and the faceplate. The sheet of flexible graphite may be characterized by a first thickness proximate the first heater coil. The sheet of flexible graphite may be characterized by a second thickness different from the first thickness proximate the second heater coil.

Some embodiments of the present technology may encompass methods of semiconductor processing. The methods may include flowing a carbon-containing precursor into a processing chamber. The processing chamber may include a faceplate, and a faceplate heater seated on the faceplate. The faceplate heater may include a first heater coil extending proximate a first area of the faceplate, and a second heater coil extending proximate a second area of the faceplate. The processing chamber may include a substrate support on which a substrate is disposed. The methods may include powering at least one of the first heater coil or the second heater coil to induce a temperature gradient across the faceplate. The methods may include generating a plasma of the carbon-containing precursor within the processing chamber. The methods may include depositing a carbon-containing material on the substrate.

In some embodiments, the substrate support may be maintained at a temperature of at least about 600° C. during the method. The processing chamber may also include a sheet of flexible graphite extending between the faceplate heater and the faceplate. One or more aspects of the processing chamber may induce a temperature gradient across the substrate reversed from the temperature gradient induced across the faceplate.

Such technology may provide numerous benefits over conventional systems and techniques. For example, embodiments of the present technology may improve temperature uniformity across a substrate. Additionally, the components may allow modification to accommodate any number of chambers or processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
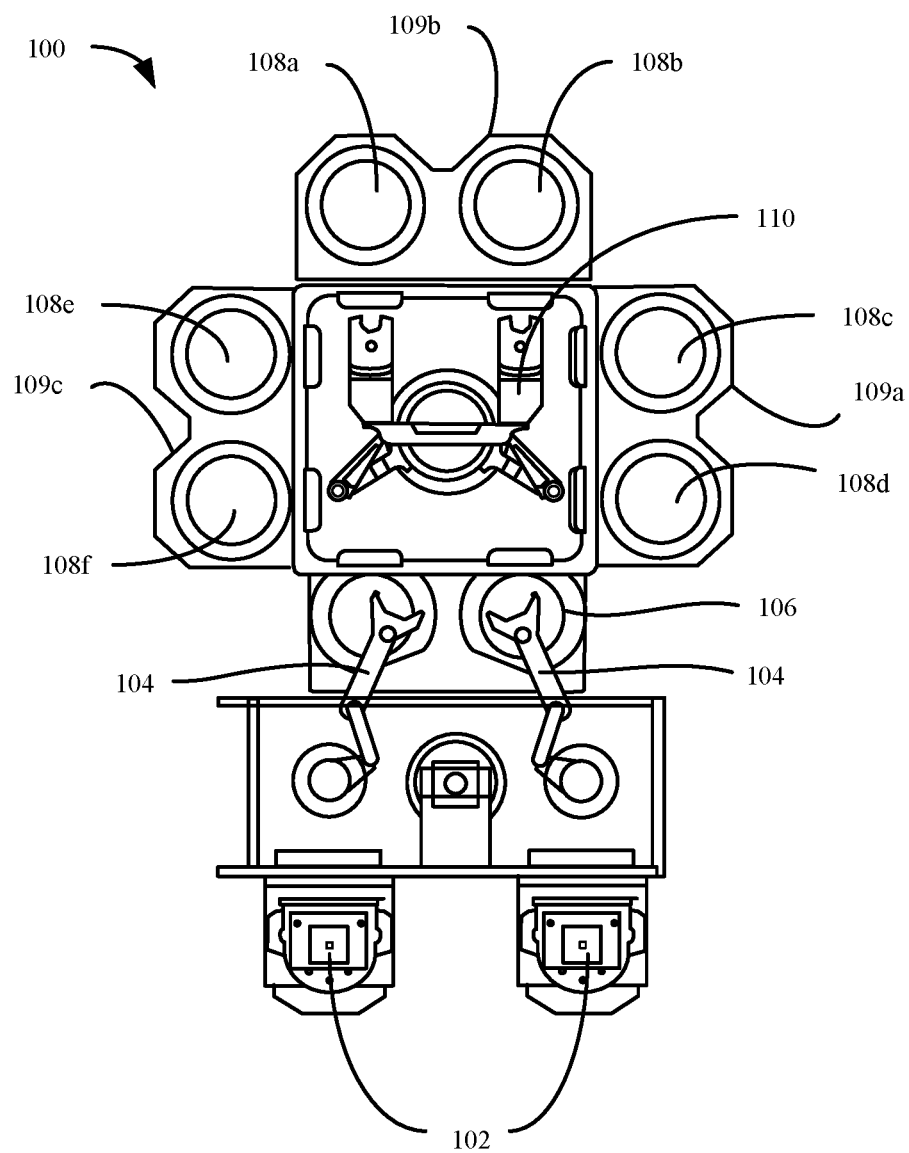
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film uniformity differences across the substrate for materials produced or removed. For example, a substrate support or heater on which a substrate is disposed may include one or more heating mechanisms to heat a substrate. When heat is delivered or lost differently between regions of a substrate, the deposition may be impacted where, for example, warmer portions of the substrate may be characterized by a different thickness of deposition or different film properties of the deposited material relative to cooler portions.

In some non-limiting examples of deposition processes, temperature sensitive applications may be further impacted. For example, some carbon-containing films may be deposited or formed at relatively higher temperatures, such as above or about 500° C., above or about 550° C., above or about 600° C., above or about 650° C., above or about 700° C., or higher. At these temperatures, radiative losses across a wide range of frequencies may increase quickly, as radiative emission increases with temperature by a power of four. For example, where the process may be performed at only twice some other processing temperatures, the thermal radiation from the pedestal or other components may increase by a factor of sixteen. Accordingly, at these higher temperatures, thermal uniformity may be more challenging to maintain, as even small differences may incur substantial heat loss. This will be described in more detail below.

The present technology overcomes these challenges during these higher temperature processes, as well as for any other process that may benefit from improved temperature uniformity. By utilizing a modular faceplate heater, increased control of heat loss from a substrate being processed may be afforded. Accordingly, the present technology may produce improved film deposition characterized by improved thickness and material property uniformity across a surface of the substrate.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
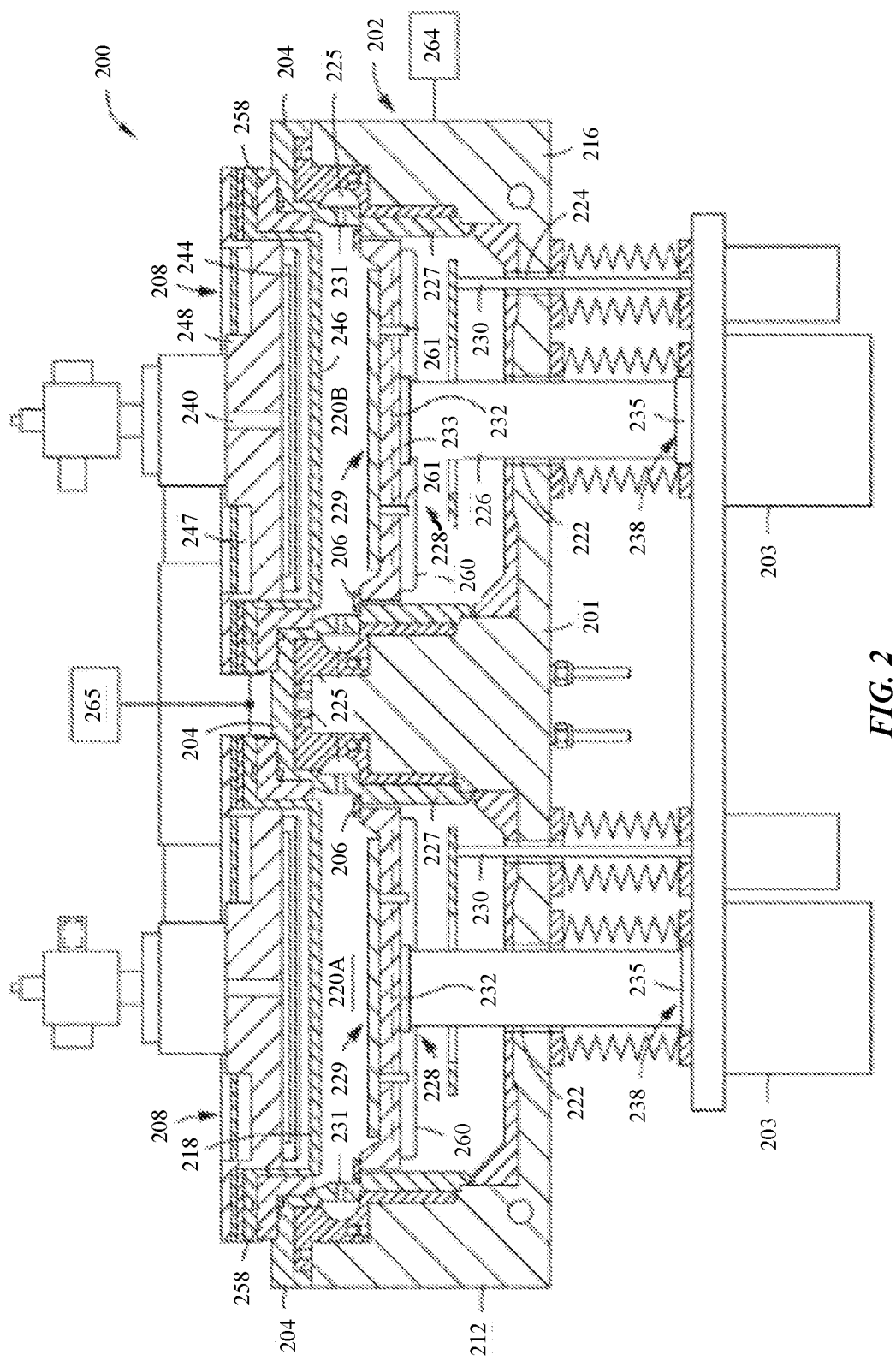
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
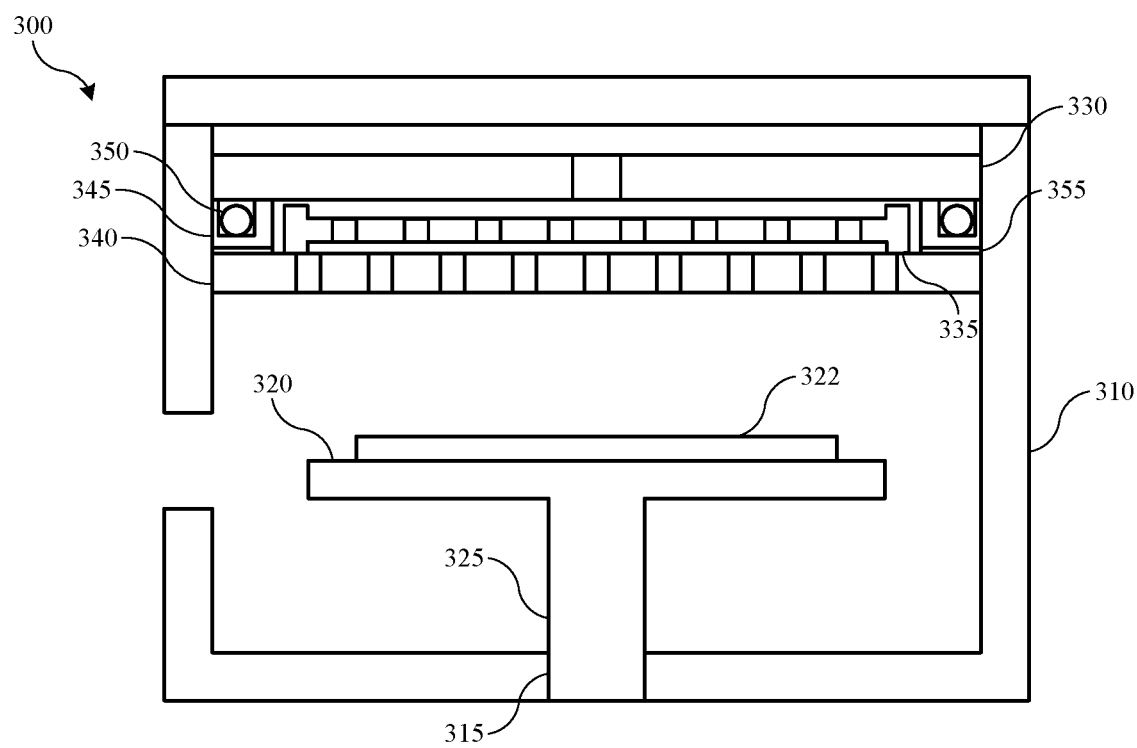
FIG. 3 shows a schematic cross-sectional view of an exemplary processing system according to some embodiments of the present technology.

FIG. 3 shows a schematic partial cross-sectional view of an exemplary processing system 300 according to some embodiments of the present technology. FIG. 3 may illustrate further details relating to components in system 200, such as for faceplate 246, for example. System 300 is understood to include any feature or aspect of system 200 discussed previously in some embodiments. The system 300 may be used to perform semiconductor processing operations including deposition of hardmask materials as previously described, as well as other deposition, removal, and cleaning operations. System 300 may show a partial view of the chamber components being discussed and that may be incorporated in a semiconductor processing system, and may illustrate a view across a center of the faceplate, which may otherwise be of any size, and include any number of apertures. Any aspect of system 300 may also be incorporated with other processing chambers or systems as will be readily understood by the skilled artisan.

System 300 may include a chamber body 310, which as illustrated may include sidewalls and a base, as well as a lid in some embodiments, all of which may at least partially define an internal volume that may include a processing region where a substrate may be processed. A pedestal or substrate support 315 may extend through the base of the chamber into the processing region as previously discussed. The substrate support may include a support platen 320, which may support semiconductor substrate 322. The support platen 320 may be coupled with a shaft 325, which may extend through the base of the chamber. System 300 may also include lid stack or gas distribution components positioned within the interior volume of the chamber, which may facilitate delivery of processing precursors more uniformly through the chamber. The components may include a gasbox 330, which may receive a precursor through a gas delivery system through the lid of the chamber body.

A blocker plate 335 may operate as a choke in some embodiments to facilitate lateral or radial distribution of precursors through the component. The blocker plate 335 may be seated on a faceplate 340, which may define a plurality of apertures through the faceplate as illustrated, and through which precursors may be delivered to access the processing region and substrate. The faceplate may also be coupled with a power source for generating a plasma of the processing precursors within the processing region of the chamber. Seated on faceplate 340 may be a faceplate heater 345, which may include one or more heater coils 350 seated in a trench defined in the faceplate heater, as will be described in more detail below. As illustrated, the faceplate heater 345 may extend about an exterior region of the faceplate, such as a region extending about an interior region of the faceplate where the plurality of apertures are defined. The faceplate heater may be an annular component in some embodiments, which may extend about the exterior region of the faceplate. As illustrated, in some embodiments, the faceplate heater may extend about the blocker plate. In some embodiments a radial gap may be maintained between the faceplate heater and the blocker plate as illustrated.

Coupling the faceplate heater with the faceplate may be any number of thermally conducting materials 355, which may ensure more complete coupling between the components. In one non-limiting example, the thermally conducting material 355 may be a sheet of flexible graphite, such as grafoil, for example, which may extend about the faceplate between the faceplate heater and the faceplate. The thermally conducting material may be characterized by material properties that may facilitate heat transfer laterally or radially, while controlling heat transfer through a thickness of the material. For example, the material may be characterized by a thermal conductivity in an xy-direction space that may be several hundreds of watts per meter-Kelvin or higher, while in a z-direction, such as vertically through the material, the thermal conductivity may be only a few watts per meter-Kelvin or less. This may facilitate uniformity of heat delivery about the faceplate in some embodiments.

As previously explained, thermal uniformity may be challenged in any processing chamber, and for higher temperature processes, radiative losses may be substantially greater. Continuing the non-limiting example explained previously, some carbon-film deposition may be performed at temperatures above 600° C., or higher, which may facilitate adsorption of carbon radicals on a surface of the substrate. To maintain these processing temperatures, the substrate support, such as substrate support 315, may include one or more heating elements, which may be operated to produce substrate or platen temperatures that may be greater than or about 500° C., and may be greater than or about 525° C., greater than or about 550° C., greater than or about 575° C., greater than or about 600° C., greater than or about 625° C., greater than or about 650° C., greater than or about 675° C., greater than or about 700° C., greater than or about 725° C., greater than or about 750° C., greater than or about 775° C., greater than or about 800° C., or higher.

While the substrate and aspects of the support may be maintained at higher temperatures, the chamber body 310 as well as the faceplate 340 may be maintained at lower temperatures, such as below or about 100° C. or lower for the chamber body, and such as below or about 300° C. or lower for the faceplate. This may create one or more heat sinks that can affect the temperature profile across the substrate. For example, edge regions of the substrate or support may have higher losses to the sidewalls of the chamber, which may lower a substrate temperature radially about the substrate. This lower temperature in a radial band may produce a first kind of non-uniformity, which may exist in a band about the substrate. Similarly, as illustrated in the figure, a slit valve or chamber access may be positioned or defined through a portion of the chamber body. This access may be characterized by a lower temperature than other aspects of the chamber body, which may create a localized heat sink. This lower temperature in a region may create a planar non-uniformity, where a section of substrate may be characterized by lower temperature.

Some embodiments of the present technology may utilize processing chambers that may have a hinged lid for accessing the chamber. Because of the hinged design, contact between components nearest the hinge may be different from contact between components furthest from the hinge, which may affect heat transfer through the components in a skew across the chamber. Additionally, an electrical contact for RF may have a single point of contact on the faceplate, which may impact aspects of the faceplate, including the material properties or morphology of the plate. For example, while operating the faceplate as a plasma-generating electrode, an electrical interaction may occur within the faceplate, which in some embodiments may be an alloy, such as an aluminum alloy, and one or more materials, such as magnesium, may migrate to the surface of the faceplate. This may impact the emissivity of the faceplate within some regions, but not uniformly across the faceplate.

Because the substrate is directly facing the faceplate, the faceplate may be characterized by high radiative coupling with the substrate. As the faceplate may be maintained at a temperature lower than the substrate, such as 250° C. for the faceplate and over 600° C. for the substrate, for example, issues with the faceplate may have a large impact on the substrate temperature, and on the film being deposited.

Temperature at the substrate may be closely correlated to the extinction coefficient of the film, and thus, temperature fluctuations across the film, which may result in thickness variations, may also result in extinction coefficient variation across the film, which may impact subsequent lithography or etching operations. As the faceplate may be directly facing the substrate, issues with temperature or emissivity non-uniformity at the faceplate may affect local temperatures on the substrate in combination with the chamber signature. The present technology may utilize faceplate heating to counter other planar gradient effects by incorporating a faceplate heater that utilizes multiple, independently operable heater coils.

Figure 4:
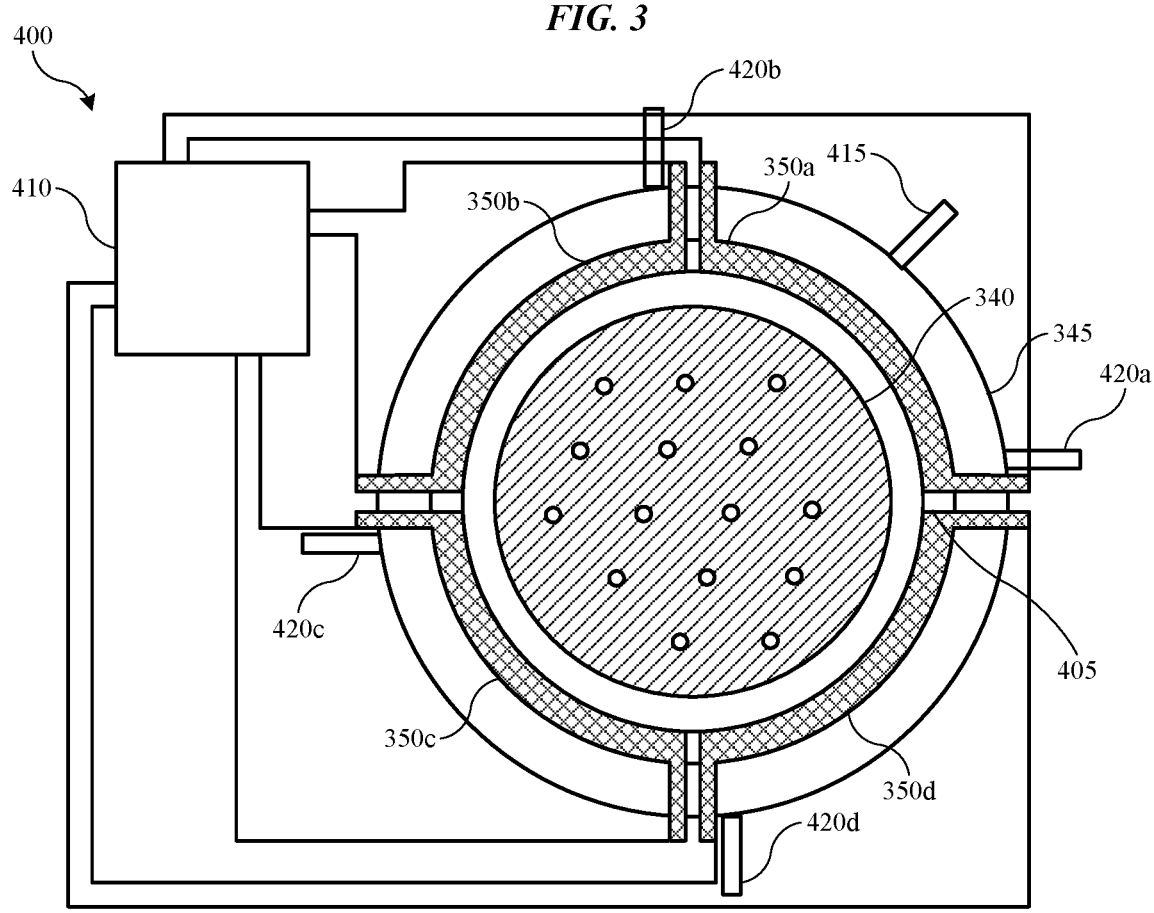
FIG. 4 shows a schematic top views of an exemplary faceplate assembly according to some embodiments of the present technology.

FIG. 4 shows a schematic top view of an exemplary faceplate assembly 400 according to some embodiments of the present technology, and may show a partial view of the faceplate 340 and faceplate heater 345 described above. Faceplate assembly 400, or any of the constituent components such as faceplate heater 345, may be incorporated into any of the chambers previously described, as well as into any other chamber that may benefit from independent temperature control at different regions of the faceplate. Faceplate assembly 400 may also include any aspect of components described above, including a flexible graphite material or other thermally conducting material disposed between the faceplate and faceplate heater. For example, the figure illustrates the interior region of faceplate 340 where apertures may be defined, and the faceplate heater 345, which may be an annular component as illustrated, and which may overly the exterior region of the faceplate. As noted previously, temperature across the substrate may be difficult to maintain uniformly due to a number of characteristics of the equipment. For example, at a center of the substrate, the deposition may be slightly higher from a first temperature effect, such as where the shaft may produce conductive heat losses, which may lower the center temperature, and increase sticking of deposition materials in the region.

Additionally, at an edge region, a larger view factor may occur to the cooler chamber walls, which may cause greater radiative heat losses, and even higher deposition on the substrate. In the mid region of the substrate, the least amount of losses may occur, and consequently the local temperature may be highest in this region, which in some embodiments may lower the thickness of the film. This may also impact the extinction coefficient of the film, which may then vary across the film between the central, middle, and edge regions. A third, and random, effect may include a chamber signature, which may also impact any aspect of the temperature profile and distribution within the chamber. For example, location of the slit valve, or pumping outlet may cause an asymmetry within the chamber, which may affect temperature profiles, and may cause a planar skew of wafer temperature across the substrate, such as lower temperatures nearer to the slit valve, and higher temperatures further from the slit valve across the chamber. To compensate for all of these effects, some embodiments of the present technology may modify the faceplate heater to enable the faceplate temperature to be skewed in a gradient that may be the reverse of the gradient caused by the chamber configuration.

As illustrated, in some embodiments of the present technology, the faceplate heater 345 may include two or more heater coils 350 distributed about the faceplate. The faceplates may include greater than or about two heater coils, and may include greater than or about three heater coils, greater than or about four heater coils, greater than or about five heater coils, greater than or about six heater coils, or more, which may provide additional control over temperature in regions of the faceplate. For example, a first faceplate heater coil 350a may extend partially through the faceplate heater trench 405, such as along a first segment of the trench, and may be positioned near or proximate a first area of the faceplate. A second faceplate heater coil 350b may extend partially through the faceplate heater trench, such as along a second segment of the trench adjacent the first segment of the trench, and may be positioned near or proximate a second area of the faceplate. A third faceplate heater coil 350c may extend partially through the faceplate heater trench, such as along a third segment of the trench adjacent the second segment of the trench, and may be positioned near or proximate a third area of the faceplate. Additionally, a fourth faceplate heater coil 350d may extend partially through the faceplate heater trench, such as along a fourth segment of the trench adjacent the third segment of the trench, and may be positioned near or proximate a fourth area of the faceplate. Any number of additional heater coils may also be included within the heater as would be understood to be similarly encompassed by the present technology.

One or more power sources 410 may be used to independently operate or power the heater coils. Power source 410 may be configured to control each heater coil 350 separately, and may be configured to deliver different amounts of power to any of the heater coils at any time, including delivering power to some but not all of the heater coils in some embodiments. In this way, the faceplate may be operated to accommodate a temperature skew on the substrate caused by planar shifts in the temperature profile across the substrate. For example, as explained above, the faceplate may act as a heatsink facing the substrate where the faceplate is maintained at a lower temperature than the substrate during processing. By increasing the temperature within a particular area on the faceplate, the corresponding area of the substrate will have lower radiative heat losses, which may increase the local temperature in that region. Accordingly, a temperature gradient may be produced across the faceplate, which may be the opposite of a gradient occurring within the chamber, such as across the chamber from the slit valve to the region opposite the slit valve. For example, as temperature may be lower on the substrate nearer to the slit valve, a corresponding area of the faceplate may be controlled to have an increased temperature relative to one or more other regions of the faceplate, which may compensate for the area loss from the slit valve. Any number of adjustments may be made to the temperature profile across the faceplate, which may allow the faceplate to adjust to any particular chamber profile or signature.

Although temperature may be monitored or correlated based on the resistance of the heater coil and the power delivered to the coil, in some embodiments, one or more thermocouples may be incorporated within the assembly. For example, a faceplate thermocouple 415 may be included in the assembly to monitor a local temperature of the faceplate. In some embodiments multiple faceplate thermocouples may be incorporated in the system to monitor temperature at different locations to ensure a gradient is formed as desired across the faceplate. Additionally, one or more faceplate heater thermocouples 420 may be included in the assembly as well. In some embodiments as illustrated, a faceplate heater thermocouple 420 may be included at each section of the heater corresponding to a particular heater coil. For example, a first faceplate heater thermocouple 420a may be included within the section of the heater in which the first heater coil 350a may be seated. A second faceplate heater thermocouple 420b may be included within the section of the heater in which the second heater coil 350b may be seated. A third faceplate heater thermocouple 420c may be included within the section of the heater in which the third heater coil 350c may be seated. A fourth faceplate heater thermocouple 420d may be included within the section of the heater in which the fourth heater coil 350d may be seated. Any additional number of thermocouples may also be included, as well as fewer thermocouples in some embodiments.

Additional aspects of the technology may tailor one or more characteristics based on known temperature profiles within the chamber. For example, in some embodiments to facilitate a skew in a particular orientation, the sheet of flexible graphite or other thermally conducting material 355 may have a varied thickness about the sheet. As stated above, the material may be characterized by lower thermal conductivity through a thickness of the material. Accordingly, in some embodiments the thermally conducting material may be characterized by a first thickness proximate or underlying the first heater coil, and may be characterized by a second thickness different from the first thickness proximate or underlying the second heater coil, or any other heater coil. Although this may facilitate control of some thermal skew, once disposed within the chamber, the material may no longer be capable of further tuning, unlike the temperature of any of the heater coils, which may be modulated during processing or at any other time to compensate for any particular planar skew caused by the processing chamber signature.

Figure 5:
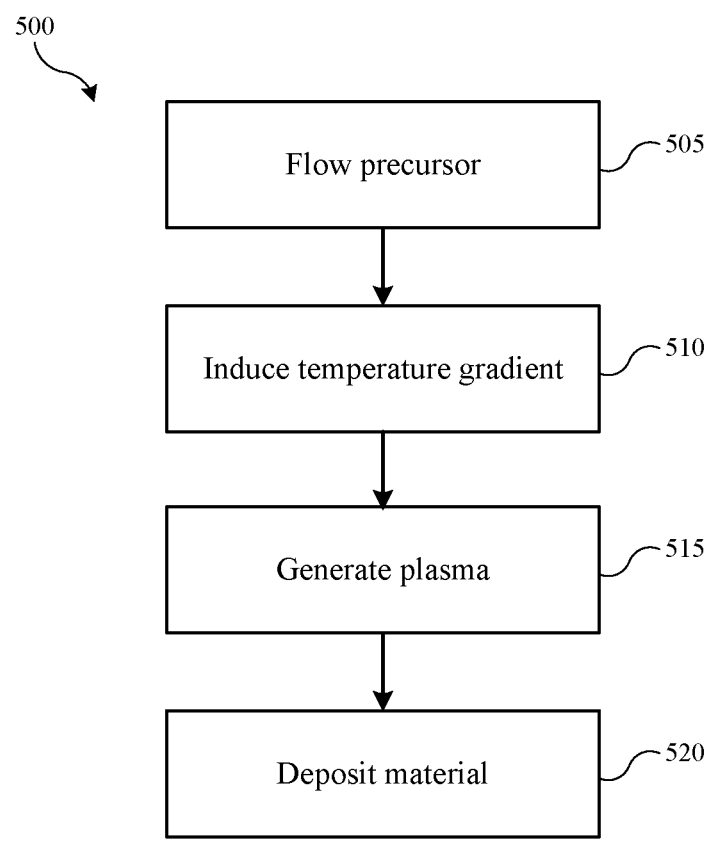
FIG. 5 shows operations of an exemplary method of semiconductor processing according to some embodiments of the present technology.

Turning to FIG. 5 is shown operations of an exemplary method 500 of semiconductor processing according to some embodiments of the present technology. The method may be performed in a variety of processing chambers, including processing system 200 or processing system 300 described above, which may include faceplate assemblies or components according to embodiments of the present technology, such as any faceplate, faceplate heater, or other component discussed previously. For example, the chamber may include a faceplate heater including a number of heater coils as previously described. Method 500 may include a number of optional operations, which may or may not be specifically associated with some embodiments of methods according to the present technology.

Method 500 may include a processing method that may include operations for forming a hardmask film or other deposition operations. The method may include optional operations prior to initiation of method 500, or the method may include additional operations. For example, method 500 may include operations performed in different orders than illustrated. In some embodiments, method 500 may include flowing one or more precursors into a processing chamber at operation 505. For example, the precursor may be flowed into a chamber, such as included in system 200, and may flow the precursor through one or more of a gasbox, a blocker plate, or a faceplate, prior to delivering the precursor into a processing region of the chamber to interact with a substrate seated on a substrate support. In some embodiments the precursor may be or include a carbon-containing precursor, although any other deposition processes may similarly be performed.

In some embodiments, a faceplate heater may be included in the system about an exterior region of the faceplate, such as about the blocker plate as previously described. Any of the other characteristics of faceplate heaters described previously may also be included, including any aspect of faceplate assembly 400 described above. As discussed above, the chamber in which the process is being performed may produce a planar temperature skew across the substrate due to characteristics of the chamber. At operation 510 one or more heater coils of the faceplate may be powered or controlled to induce a temperature gradient across the faceplate. The induced gradient may be enacted to be the reverse of, or to counteract, a gradient induced by aspects of the processing chamber as previously described.

At operation 515, a plasma may be generated of the precursors within the processing region, such as by providing RF power to the faceplate to generate a plasma. Material formed in the plasma, such as a carbon-containing material, may be deposited on the substrate at operation 520. The substrate support may be maintained at a temperature of greater than or about 600° C., or any other temperature discussed previously during the process. By utilizing faceplate assemblies or faceplate heaters as described above, the present technology may provide a tunable feature, which may be operated to induce a temperature gradient across a faceplate, and which may be used to counteract a chamber signature for any of a variety of chamber configurations. These configurations may allow selective tuning of processes, as well as reconfigurations based on adjustments to the temperature gradient developed across the faceplate, if needed.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater coil" includes a plurality of such heater coils, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing system comprising:
    a chamber body comprising sidewalls and a base, the chamber body defining an interior volume;
    a substrate support extending through the base of the chamber body, wherein the substrate support is configured to support a substrate within the interior volume;
    a faceplate positioned within the interior volume of the chamber body, wherein the faceplate defines a plurality of apertures through the faceplate;
    a faceplate heater seated on the faceplate, wherein the faceplate heater comprises:
        a first heater coil extending a first radial distance from center of the faceplate and proximate a first area of the faceplate, and
        a second heater coil extending a second radial distance from center of the faceplate and proximate a second area of the faceplate, wherein the first radial distance and second radial distance are the same; and
    a sheet of thermally conducting material extending between the faceplate heater and the faceplate.

2. The semiconductor processing system of claim 1, wherein the first heater coil and the second heater coil are independently operable.

3. The semiconductor processing system of claim 1, wherein the faceplate heater comprises an annular component seated about an exterior region of the faceplate.

4. The semiconductor processing system of claim 3, further comprising:
    a blocker plate seated on the faceplate, wherein the faceplate heater extends about the blocker plate.

5. The semiconductor processing system of claim 3, wherein the faceplate heater defines a trench about the annular component, wherein the first heater coil extends about a first segment of the trench, and wherein the second heater coil extends about a second segment of the trench adjacent the first segment of the trench.

6. The semiconductor processing system of claim 1, wherein the faceplate heater comprises at least one thermocouple disposed within the faceplate heater.

7. The semiconductor processing system of claim 1, wherein the faceplate heater comprises at least four heater coils.

8. The semiconductor processing system of claim 1, wherein the sheet of thermally conducting material comprises a sheet of flexible graphite.

9. The semiconductor processing system of claim 8, wherein the sheet of flexible graphite is characterized by a first thickness proximate the first heater coil, and wherein the sheet of flexible graphite is characterized by a second thickness different from the first thickness proximate the second heater coil.

10. A semiconductor processing chamber faceplate assembly, comprising:
   a faceplate defining a plurality of apertures through the faceplate;
   an annular faceplate heater coupled with the faceplate, wherein the annular faceplate heater comprises:
      a first heater coil extending proximate a first area of the faceplate, and
      a second heater coil extending proximate a second area of the faceplate, wherein the first heater coil and the second heater coil form arc-shaped portions of the annular faceplate heater; and
   a sheet of thermally conducting material extending between the faceplate heater and the faceplate.

11. The semiconductor processing chamber faceplate assembly of claim 10, further comprising:
   a power source coupled with each of the first heater coil and the second heater coil, wherein the power source is configured to independently power the first heater coil and the second heater coil.

12. The semiconductor processing chamber faceplate assembly of claim 10, wherein the plurality of apertures are defined within an interior region of the faceplate, and wherein the annular faceplate heater comprises an annular component seated about an exterior region of the faceplate extending about the interior region of the faceplate.

13. The semiconductor processing chamber faceplate assembly of claim 12, wherein the annular faceplate heater defines a trench about the annular component, wherein the first heater coil extends about a first segment of the trench, and wherein the second heater coil extends about a second segment of the trench adjacent the first segment of the trench.

14. The semiconductor processing chamber faceplate assembly of claim 13, further comprising:
   a third heater coil extending proximate a third area of the faceplate, and
   a fourth heater coil extending proximate a fourth area of the faceplate, wherein the third heater coil extends about a third segment of the trench adjacent the second segment of the trench, and wherein the fourth heater coil extends about a fourth segment of the trench adjacent the third segment of the trench.

15. The semiconductor processing chamber faceplate assembly of claim 10, wherein the sheet of thermally conducting material comprises a sheet of flexible graphite.

16. The semiconductor processing chamber faceplate assembly of claim 15, wherein the sheet of flexible graphite is characterized by a first thickness proximate the first heater coil, and wherein the sheet of flexible graphite is characterized by a second thickness different from the first thickness proximate the second heater coil.

* * * * *